(12) United States Patent
Ogata

(10) Patent No.: US 8,386,063 B2
(45) Date of Patent: Feb. 26, 2013

(54) ELECTRONIC COMPONENT MOUNTING APPARATUS AND STOPPING METHOD OF ELECTRONIC COMPONENT MOUNTING APPARATUS

(75) Inventor: Yuji Ogata, Fukuoka (JP)

(73) Assignee: Panasonic Corporation, Osaka (JP)

( * ) Notice: Subject to any disclaimer, the term of this patent is extended or adjusted under 35 U.S.C. 154(b) by 403 days.

(21) Appl. No.: 12/808,583

(22) PCT Filed: Dec. 26, 2008

(86) PCT No.: PCT/JP2008/073972
§ 371 (c)(1),
(2), (4) Date: Jun. 16, 2010

(87) PCT Pub. No.: WO2009/082037
PCT Pub. Date: Jul. 2, 2009

(65) Prior Publication Data
US 2010/0268369 A1    Oct. 21, 2010

(30) Foreign Application Priority Data
Dec. 26, 2007   (JP) .................................. 2007-333764

(51) Int. Cl.
*G06F 19/00*   (2011.01)
*G06F 7/00*   (2006.01)
*B65H 1/00*   (2006.01)

(52) U.S. Cl. ..................... 700/110; 414/222.01; 700/95; 700/96; 700/108; 700/112; 700/116; 700/117; 700/122; 700/159; 700/204; 700/230

(58) Field of Classification Search ............. 414/222.01; 700/95, 96, 108, 110, 112, 116, 117, 122, 700/159, 204, 230
See application file for complete search history.

(56) References Cited

U.S. PATENT DOCUMENTS

| 4,306,292 A | * | 12/1981 | Head, III | ....................... 700/100 |
| 4,485,125 A | * | 11/1984 | Izu et al. | .......................... 427/74 |
| 5,138,869 A | * | 8/1992 | Tom | ............................. 73/31.03 |

(Continued)

FOREIGN PATENT DOCUMENTS

| JP | 11-150399 A | 6/1999 |
| JP | 2001-144499 A | 5/2001 |

(Continued)

OTHER PUBLICATIONS

International Search Report for PCT/JP2008/073972, 2 pages Jul. 21, 2009.

*Primary Examiner* — Charles R Kasenge
*Assistant Examiner* — Thomas Stevens
(74) *Attorney, Agent, or Firm* — Pearne & Gordon LLP

(57) ABSTRACT

A foreign matter detection unit detects an entry of an unexpected foreign matter that is other than the substrates by light transmitting optical sensors 7 having light projecting portions 7a and light receiving portions 7b at opening sections 3a, 3b formed in cover members 2 through which the substrates pass. By executing an emergency stop processing, when the entry of the foreign matter is detected at one of the opening sections, to stop the electronic component mounting apparatus that is adjacent to the opening section at which the entry of the foreign matter is detected, safety of the machine operators is properly ensured in check and confirmation works conducted at the time of machine troubles etc even in an electronic component assembling line in which the small-sized thin unit apparatuses are combined.

4 Claims, 4 Drawing Sheets

U.S. PATENT DOCUMENTS

| | | | | |
|---|---|---|---|---|
| 5,231,585 A | * | 7/1993 | Kobayashi et al. | 700/96 |
| 5,305,221 A | * | 4/1994 | Atherton | 700/96 |
| 5,338,157 A | * | 8/1994 | Blomquist | 417/2 |
| 5,536,128 A | * | 7/1996 | Shimoyashiro et al. | 414/273 |
| 5,614,443 A | * | 3/1997 | Nakashima et al. | 156/253 |
| 5,727,332 A | * | 3/1998 | Thrasher et al. | 34/277 |
| 5,856,198 A | * | 1/1999 | Joffe et al. | 436/100 |
| 5,867,389 A | * | 2/1999 | Hamada et al. | 700/121 |
| 6,168,085 B1 | * | 1/2001 | Garcia | 236/44 C |
| 6,200,414 B1 | * | 3/2001 | Hwang et al. | 156/345.18 |
| 6,259,960 B1 | * | 7/2001 | Inokuchi | 700/110 |
| 6,645,355 B2 | * | 11/2003 | Hanson et al. | 204/198 |
| 6,885,906 B2 | * | 4/2005 | Nishihata et al. | 700/121 |
| 6,985,788 B2 | * | 1/2006 | Haanstra et al. | 700/121 |
| 2002/0144785 A1 | * | 10/2002 | Srivastava et al. | 156/345.35 |
| 2003/0014145 A1 | * | 1/2003 | Reiss et al. | 700/121 |
| 2003/0168353 A1 | * | 9/2003 | Suzuki et al. | 205/765 |
| 2003/0221702 A1 | * | 12/2003 | Peebles | 134/1 |
| 2003/0235926 A1 | * | 12/2003 | Knollenberg et al. | 436/181 |
| 2004/0262290 A1 | * | 12/2004 | Haanstra et al. | 219/490 |
| 2004/0262548 A1 | * | 12/2004 | Komatsu | 250/559.4 |
| 2005/0220574 A1 | | 10/2005 | Chen | |
| 2005/0228525 A1 | * | 10/2005 | Brill et al. | 700/112 |
| 2006/0075965 A1 | * | 4/2006 | Lee et al. | 118/683 |
| 2006/0196023 A1 | * | 9/2006 | Lee | 29/17.3 |
| 2007/0009345 A1 | * | 1/2007 | Hall et al. | 414/222.01 |
| 2009/0053837 A1 | * | 2/2009 | Khoche et al. | 438/14 |

FOREIGN PATENT DOCUMENTS

| | | |
|---|---|---|
| JP | 2003-060399 A | 2/2003 |
| JP | 2003-198187 A | 7/2003 |
| JP | 2004-104075 A | 4/2004 |

* cited by examiner

ELECTRONIC COMPONENT MOUNTING APPARATUS AND STOPPING METHOD OF ELECTRONIC COMPONENT MOUNTING APPARATUS

TECHNICAL FIELD

This invention relates to an electronic component mounting apparatus, constituting an electronic component assembling line in which component-mounted substrates are manufactured by mounting electronic components on substrates and a stopping method of an electronic component mounting apparatus in an emergency.

BACKGROUND ART

An electronic component assembling line in which component-mounted substrates are manufactured by mounting electronic components on substrates is formed as a single manufacturing line by combining plural electronic component mounting apparatuses such as screen printing apparatuses, electronic component loading apparatuses, inspection apparatuses and the like. In such electric component mounting apparatuses, safety mechanisms are provided for ensuring the safety to machine operators during operations. For example, when a cover lid that is provided on a cover to shield a driving part in the apparatus such as a working head is opened for maintenance and checking service or the like, the driving part in the apparatus stops its operation by means of an interlocking mechanism configured between a switch to detect opening of the lid and the driving part in the apparatus. As a result, it is avoid an unsafe condition such that a machine operator uncautiously accesses to the driving part in the apparatus during operation.

In recent years, wide variety and low volume production becomes common in production of electronic devices. In manufacturing facilities, in order to improve area production efficiency and flexibility, there is an increasing demand in manufacturing facilities in which line flexibility is enhanced by constituting a component assembling line is formed by combining plural small-sized manufacturing facilities (See, for example, JP-A-2004-104075).

In the prior art disclosed in JP-A-2004-104075, plural thin unit apparatuses, each having a dimension of approximately 300 to 400 mm in substrate carrying direction, are detachably combined to form an assembling line for electronic components. By this construction, the assembling line configuration can be easily changed in accordance with products to be manufactured, so that it is possible to obtain more flexible production environment.

However, in such facilities in which small-sized thin unit apparatuses are combined as described above, there is a fear that unsafe the condition cannot be sufficiently avoided only by normal interlock mechanisms to ensure safety of the machine operators during the operation. More specifically, when a trouble arises in an operation of one apparatus, the machine operator accesses to the apparatus so that the operator opens the cover lid or inserts a hand or a part of the body through an opening, there is a fear that the operator's hand or the like could be brought into contact with a driving part of an adjacent apparatus even if the apparatus in trouble has been stopped by the interlock mechanism since the adjacent apparatus is located near the apparatus in trouble. Therefore, in manufacturing facilities in which such small-sized thin unit apparatuses are combined, there is a need to establish an advanced safety measure that is further than the conventional safety system.

DISCLOSURE OF THE INVENTION

In view of the above circumstances, an object of the invention is to provide an electronic component mounting apparatus and a stopping method of an electronic component mounting apparatus in an emergency, in which safety of machine operators can be reliably ensured in facilities in which small-sized thin unit apparatuses are combined.

The invention provides an electronic component mounting apparatus, a plural ones of which are combined to constitute an electronic component assembling line in which component-mounted substrates are manufactured by mounting electronic components on substrates, the electronic component mounting apparatus comprising:

a substrate carry unit provided with a carrying path arranged between an upstream end and a downstream end thereof to carry the substrates in the electronic component assembling line;

a working operation unit executing a working operation to mount components to the substrates that are carried by the substrate carry unit;

a pair of opening sections through which the substrates pass and which are located at the upstream end and the downstream end of the substrate carry unit so as to be formed in cover members to shut the electronic component mounting apparatus, a foreign matter detection unit detecting an entry of an unexpected foreign matter that is other than the substrates through opening sections located at the upstream end and the downstream end;

an adjacent apparatus stop processing unit executing an emergency stop processing, when the entry of the foreign matter is detected at one of the opening sections, to stop the electronic component mounting apparatus that is adjacent to the opening section at which the entry of the foreign matter is detected.

The invention also provides a stopping method of an electronic component mounting apparatus in an emergency, a plural ones of which are combined to constitute an electronic component assembling line in which component-mounted substrates are manufactured by mounting electronic components on substrates, the electronic component mounting apparatus comprising:

a substrate carry unit provided with a carrying path arranged between an upstream end and a downstream end thereof to carry the substrates in the electronic component assembling line;

a working operation unit executing a working operation to mount components to the substrates that are carried by the substrate carry unit;

a pair of opening sections through which the substrates pass and which are located at the upstream end and the downstream end of the substrate carry unit so as to be formed in cover members to shut the electronic component mounting apparatus, a foreign matter detection unit detecting an entry of an unexpected foreign matter that is other than the substrates through opening sections located at the upstream end and the downstream end;

wherein an emergency stop processing is executed, when the entry of the foreign matter is detected at one of the opening sections, to stop the electronic component mounting apparatus that is adjacent to the opening section at which the entry of the foreign matter is detected.

According to the invention, a foreign matter detection unit detecting an entry of an unexpected foreign matter that is other than the substrates at opening sections formed in cover members through which the substrates pass. By executing an emergency stop processing, when the entry of the foreign matter is detected at one of the opening sections, to stop the electronic component mounting apparatus that is adjacent to the opening section at which the entry of the foreign matter is detected, safety of the machine operators is properly ensured in check and confirmation works conducted at the time of machine troubles etc even in an electronic component assembling line in which the small-sized thin unit apparatuses are combined.

BEST MODE FOR CARRYING OUT THE INVENTION

Figure 1:
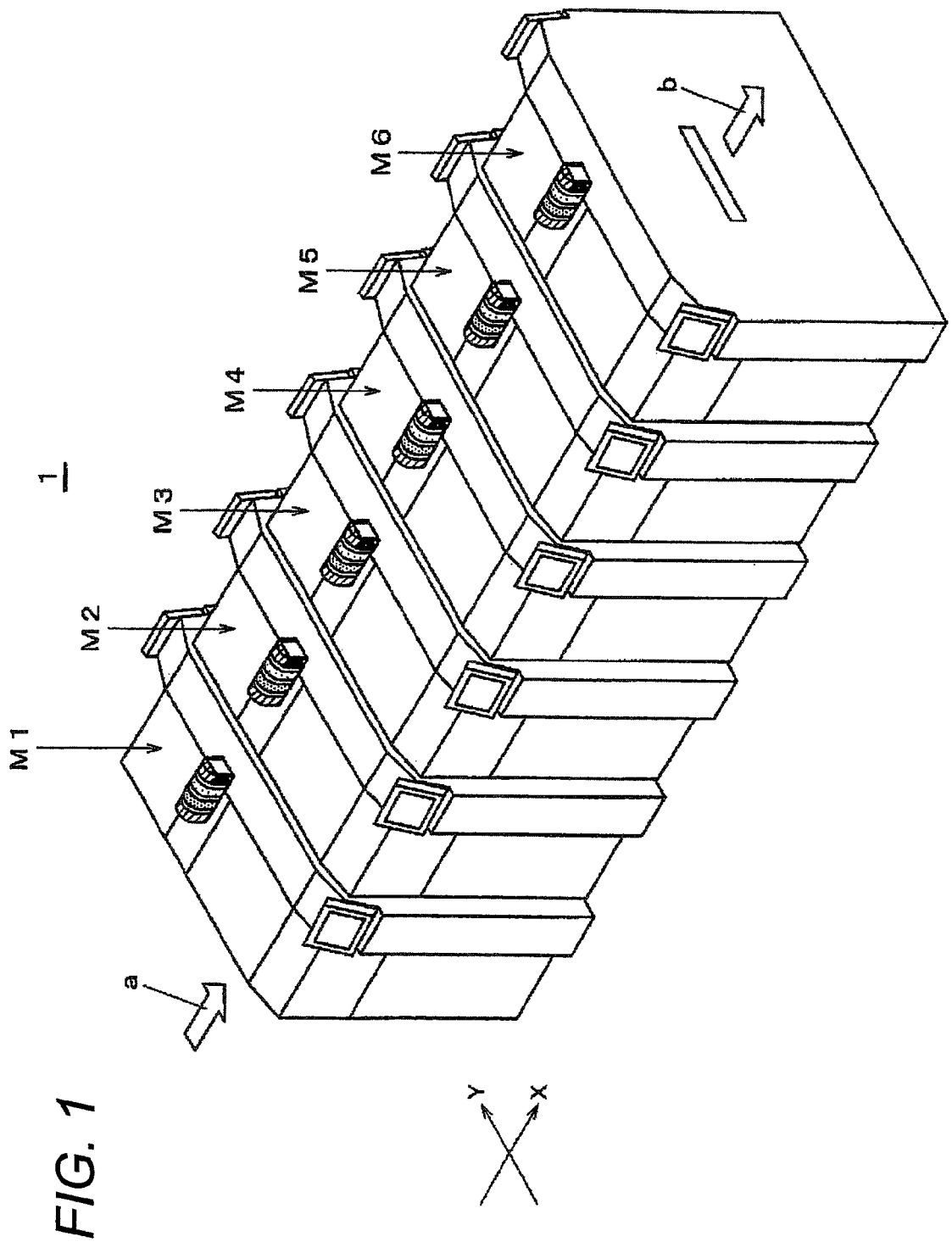
FIG. 1 is a perspective view showing an electronic component assembling line according to one embodiment of the present invention.
Figure 2:
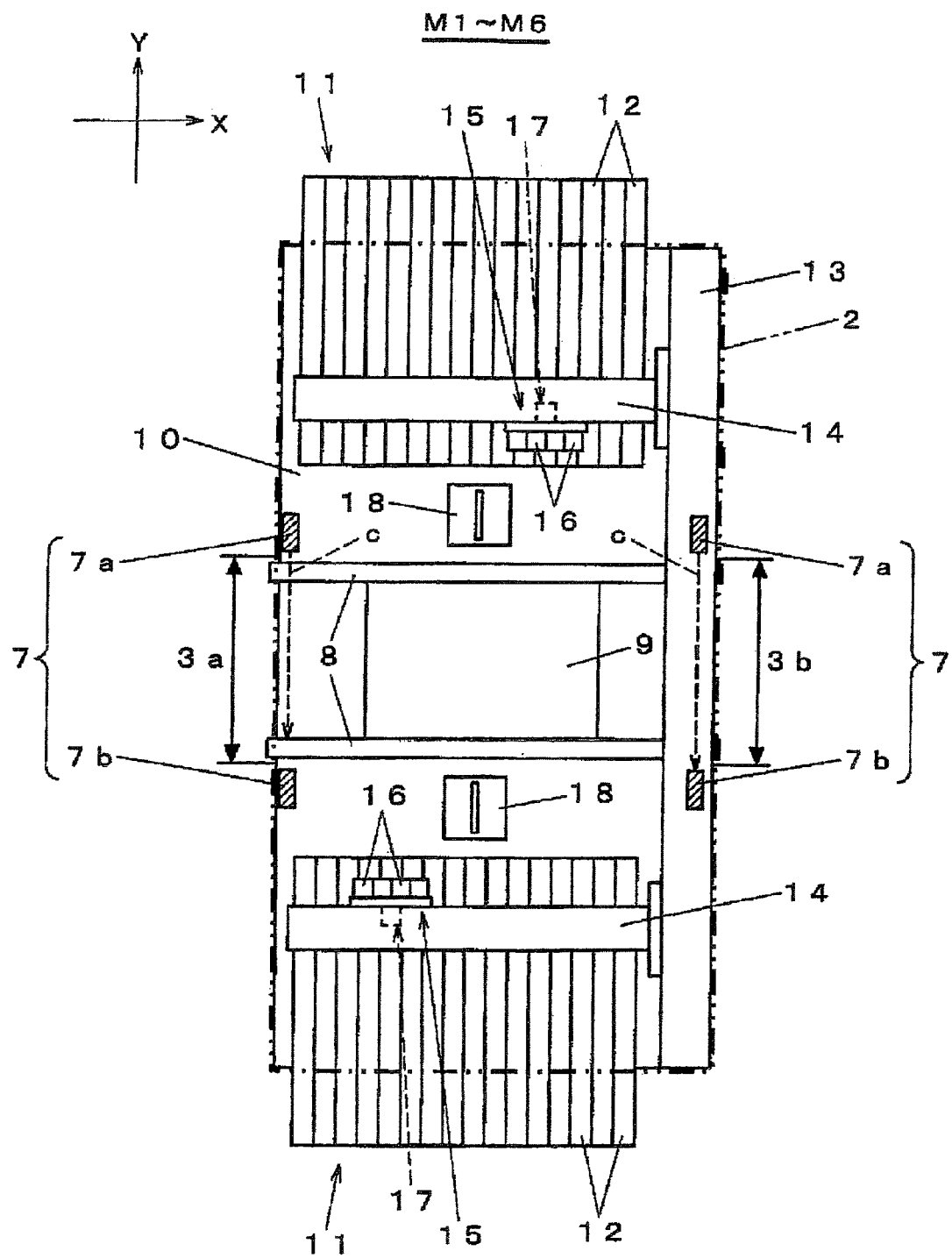
FIG. 2 is a plan view showing an electronic component mount head constituting the electronic component assembling line according to the embodiment of the present invention.
Figure 3:
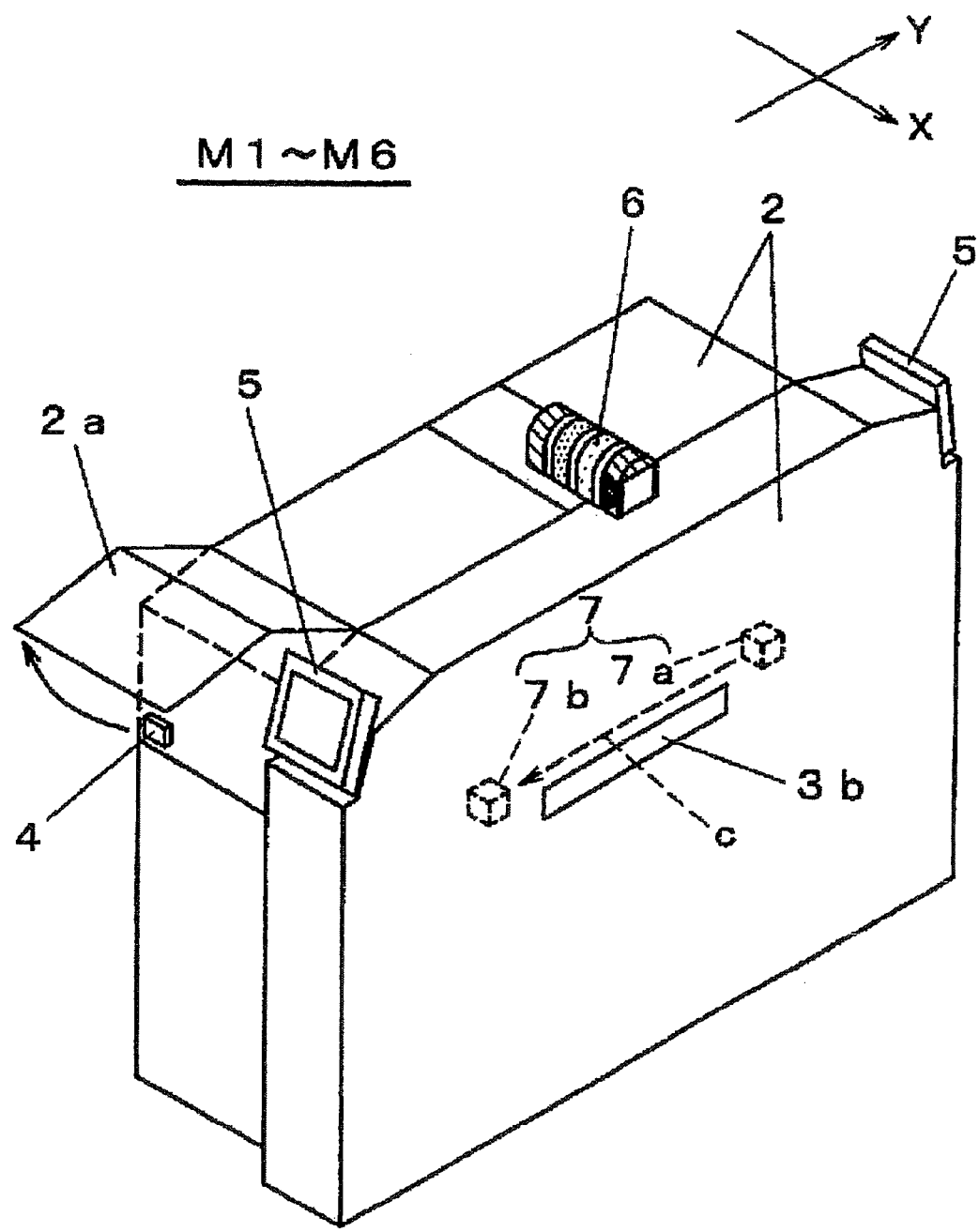
FIG. 3 is a perspective view showing the electronic component mount head constituting the electronic component assembling line according to the embodiment of the present invention.
Figure 4:
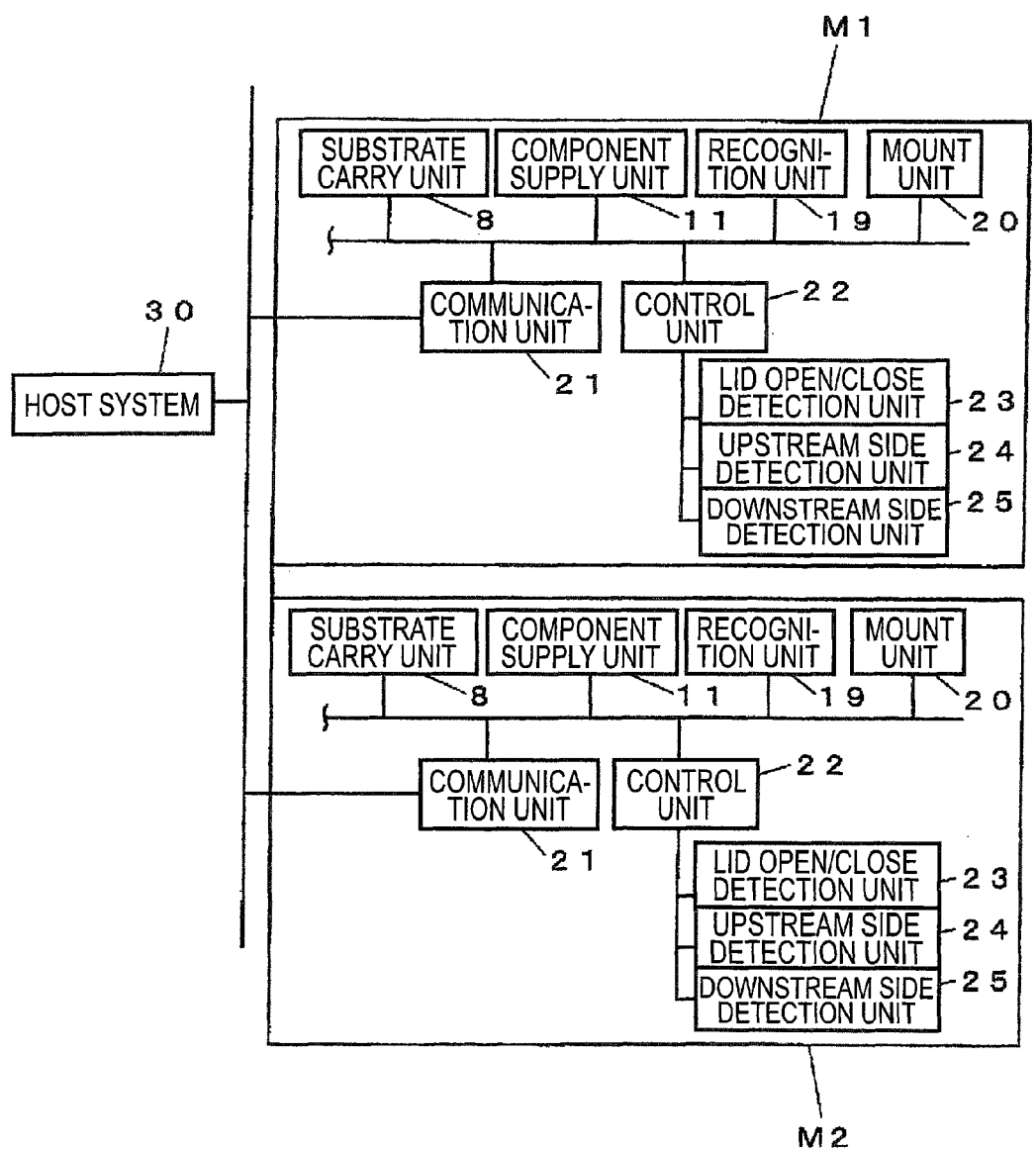
FIG. 4 is a block diagram showing a configuration of a control system in the electronic component assembling line according to the embodiment of the present invention.

A preferred embodiment of the present invention will now be described in detail with reference to the drawings. FIG. 1 is a perspective view showing an electronic component assembling line according to one embodiment of the present invention. FIG. 2 is a plan view showing an electronic component mount head constituting the electronic component assembling line according to the embodiment of the present invention. FIG. 3 is a perspective view showing the electronic component mount head constituting the electronic component assembling line according to the embodiment of the present invention. FIG. 4 is a block diagram showing a configuration of a control system in the electronic component assembling line according to the embodiment of the present invention.

Referring to FIG. 1, an electronic component assembling line 1 that is constituted by combining plural electronic component loading apparatuses as electronic component mounting apparatuses. The electronic component assembling line 1 is constituted by combining plural electronic component loading apparatuses (hereinafter, simply called "apparatuses") M1, M2, M3, M4, M5, M6 in series, so that the electronic component assembling line 1 have a function to manufacture component-mounted substrates by mounting electronic components on substrates. In the electronic component assembling line 1, substrates on which components are to be mounted are supplied from an upstream side (indicated by arrowhead a), the substrates are carried in the apparatus M1 located at the most upstream side and are further carried in X-direction (substrate carry direction) along the electronic component assembling line 1. The substrates carried-in are handled as objects to which component loading operations are conducted in each apparatus. After component loading operations, the substrates are further carried-out to the downstream side (indicated by arrowhead b).

Next, the structure of the apparatuses M1 to M6 will be described in detail with reference to FIGS. 2 and 3. In FIG. 2, a substrate carry unit 8 is arranged on a base stage 10 so as to be oriented in X-direction. The substrate carry unit 8 constitutes a carrying path of the electronic component assembling line 1 arranged between an upstream end and a downstream end thereof. The substrate 9 that is handled as an object for a mounting operation work and is carried-in from the apparatus on the upstream side is carried by the substrate carry unit 8 from the upstream side to the downstream side so as to be positioned and held at a position for component mounting operation.

Component supply units 11 are provided on opposite sides of the substrate carry unit 8. A plurality of tape feeders 12 are mounted in each component supply unit 11. A Y-axis movement table 13 provided with a linear actuation mechanism is arranged horizontally along Y-direction at one end of the base stage 10 in X-direction. Similarly to Y-axis movement table 13, a pair of X-axis movement tables 14 each of which is provided with a linear actuation mechanism are coupled to the Y-axis movement table 13. A mount head 15 that is movable in X-direction is installed in each X-axis movement table 14.

The mount head 15 is configured as a multiple mount head provided with plural (four in this embodiment) single mount heads 16. Each single mount head 16 is capable of sucking and holding an electronic component with a suction nozzle (not shown) provided on a lower end of the head. The Y-axis movement table 13 and the X-axis movement tables 14 constitute a head movement mechanism. By driving this head movement mechanism, the mount head 15 is moved in X-direction and Y-direction to pick up electronic components from the tape feeders 12 and to mount the electronic components on the substrate 9 positioned in the substrate carry unit 8.

The Y-axis movement table 13, the X-axis movement tables 14 and the mount head 15 constitute a mount unit which mounts the electronic components to the substrate 9 by moving the mount head 15 that carries the electronic components. (Namely, this unit constitutes a working operation unit executing a working operation to mount the electronic components to the substrates 9 that are carried by the substrate carry unit 8 in each of the apparatuses M1 to M6 as the electronic component mounting apparatus). Component recognition cameras 18 are disposed between the respective component supply unit 11 and the substrate carry unit 8, so that the component recognition cameras 18 capture images of the electronic components in a state that the electronic components are held by the mount heads 15 when the mount heads 15 that have picked up the electronic components pass above the component recognition cameras 18.

A substrate recognition camera 17 is attached to each mount head 15 so as to be located on a lower face of the X-axis movement table 14 and moved integrally with the mount head 15. By moving the mount head 15, the recognition camera 17 is moved above the substrate 9 positioned by the substrate carry unit 8, and capture an image of the substrate 9 to recognize. In the mounting operation of the electronic components to the substrate 9 by the mount head 15, positional compensation is conducted to the component mounting position based on a recognition result of the electronic components by the component recognition camera 18 and a recognition result of the substrate by the substrate recognition camera 17.

As shown in FIG. 3, the upper face and four side faces of each apparatus are shut by cover members 2. The side faces oriented in Y-direction are served as operation faces through which the machine operators perform operations to the apparatus and a display panel 5 for display is arranged on the operation face. Further, a signal tower 6 for annunciation is disposed on the cover member located at the top of the apparatus. Opening sections 3a, 3b through which the substrates 9 pass and which are located at the upstream end and the downstream end of the substrate carry unit 8 are provided in the cover members 2 covering the upstream side face and the downstream side face in the substrate carrying direction (X-direction) in each apparatus (See also FIG. 2).

On opposite sides of each opening section 3a, 3b, a light-transmitting type optical sensor 7 having a light projecting portion 7a and a light receiving portion 7b is arranged such that the opening area of the opening section 3a, 3b are covered with its detection scope. If a foreign matter which is not supposed to pass the opening area of the opening section 3a, 3b normally, for example, an unexpected foreign matter such as a part of the machine operator's hand enters therein, optical axis of detection light emitted from the light projecting portion 7a is shielded and light receiving condition of the light receiving portion 7b is changed. Based on this light receiving condition, the entry of the foreign matter into the opening section 3a, 3b is detected. Here, the detection scope by the optical sensor 7 is adjusted so that the substrate 9 which is supposed to pass there through in normal time should be extruded from such detection. In other words, the optical sensor 7 constituted by the light projecting portion 7a and the light receiving portion 7b functions as a foreign matter detection sensor which detects an entry of an unexpected foreign matter that is other than the substrates in the opening section 3a, 3b.

On a side of the operation face, a cover lid 2a constituted by a part of the cover member 2 configured to be openable and closable is provided for allowing the operator to access the operation area of the mount unit 20 (operation working unit) that is shut by the cover members 2 for purposes of maintenance etc. A micro switch 4 which provides switching operation according to contact and release of the cover lid 2a is arranged at an open/close position of the cover lid 2a. By monitoring a signal from the micro switch 4, the open/close state of the cover lid 2a can be detected. Under the condition that the opening of the cover lid 2a is detected, the apparatus is stopped by an interlocking function of a control system as described below.

Next, the control system will be described with reference to FIG. 4. Incidentally, the apparatuses M1 to M6 have a configuration identical to one another. Therefore, only the apparatuses M1 and M2 are shown in the figure. The control system in each apparatus is provided with the substrate carry unit 8, the component supply unit 11, the recognition unit 19, the mount unit 20, a communication unit 21 and a control unit 22. The substrate carry unit 8 performs a substrate carrying/positioning operation within this apparatus. The component supply unit 11 supplies the electronic components to the mount unit 20 by the tape feeders 12. The recognition unit 19 conducts the recognition of the position of the substrate 9 and the recognition of the electronic components held by the mount head 15, by conducting recognition processing to the recognition results of the substrate recognition camera 17 and the component recognition camera 18. The communication unit 21 performs data transmission between the apparatus and a host system 30 as other apparatuses constituting the electronic component assembling line or a host computer.

The control unit 22 executes the following processing along with a control processing for each unit in the apparatus. That is, a lid open/close detection unit 22 detects whether the cover lid 2a is in open state or close state by receiving the detection signal of the micro switch 4. An upstream side detection unit 24 executes a processing to detect a foreign matter through the opening section 3a by receiving the detection signal from the optical sensor 7 that is arranged at the opening section 3a located on the upstream side of the apparatus. A downstream side detection unit 25 executes a processing to detect a foreign matter through the opening section 3b by receiving the detection signal from the optical sensor 7 that is arranged at the opening section 3b located on the downstream side of the apparatus. In other words, both of the upstream side detection unit 24 and the optical sensor 7 arranged at the opening section 3a, and the downstream side detection unit 25 and the optical sensor 7 arranged at the opening section 3b, form a foreign matter detection unit which detects an entry of an unexpected foreign matter that is other than the substrates at the opening section on the upstream side, and the opening section on the downstream side, respectively.

Detection results by the upstream side detection unit 24 and the downstream side detection unit 25 are sent to the control unit 22. The control unit 22 executes an emergency stop processing to an adjacent apparatus in response to the detection results. If the foreign matter detection signal is received from the upstream side detection unit 24, the entry of the foreign matter through the opening section 3a is determined, and an emergency stop signal is sent to another apparatus that is adjacent to the present apparatus on the upstream side through the communication unit 21. Based on this processing, the adjacent apparatus on the upstream side that has received the emergency stop signal stops its operation. Similarly, if the foreign matter detection signal is received from the downstream side detection unit 25, the entry of the foreign matter through the opening section 3b is determined, and an emergency stop signal is sent to another apparatus that is adjacent to the present apparatus on the downstream side through the communication unit 21. Based on this processing, the adjacent apparatus on the downstream side that has received the emergency stop signal stops its operation.

In other words, in the stopping method of an electronic component mounting apparatus in an emergency according to the present embodiment, once the entry of the unexpected foreign matter that is not supposed to pass has been detected by the particular foreign matter detection unit as described above, the control unit 22 executes a processing to stop the apparatus that is adjacent to the present apparatus on the particular side on which the entry of the foreign matter has been detected at the corresponding opening section. The control unit 22 functions as an adjacent apparatus stop processing unit executing an emergency stop processing to stop the electronic component mounting apparatuses that are adjacent to the opening sections 3a, 3b. Because of such emergency stop operation, safety of the machine operators is properly ensured even in an electronic component assembling line in which the small-sized thin unit apparatuses are combined.

In the above embodiment, the emergency stop operation is conducted necessarily without any other conditions when the foreign matter detection unit detects a foreign matter other than the substrates 9. However, the control unit 22 may execute the emergency stop processing to stop the adjacent apparatus only when the cover lid 2a is in open state and the entry of the foreign matter is detected by the upstream side detection unit 24 or the downstream side detection unit 25.

More specifically, under the condition that the cover lid 2a is in close state, it is possible to determine that a part of the machine operator's body does not enter in the apparatus. Accordingly, it is possible to assume this state that the emergency stop operation is not necessary even if the entry of the foreign matter is detected by the upstream side detection unit 24 or the downstream side detection unit 25. Needless to say, it is possible to set the operation condition so as to stop the adjacent apparatus every time when the entry of the foreign matter is detected by the upstream side detection unit 24 or the downstream side detection unit 25 regardless of the detection result of the lid open/close detection unit 23.

In the above embodiment, electronic component loading apparatuses that perform loading operations to mount electronic components to substrates are taken as examples for the electronic component mounting apparatuses. However, the invention is also applicable to other apparatuses as long as these apparatuses perform working operations in component mounting process and constitutes the electronic component assembling line, such as solder printing apparatuses which print solder on substrates for bonding electronic components or inspection apparatuses which perform inspection on substrates.

The electronic component mounting apparatus and the stopping method of the electronic component mounting apparatus according to the invention are advantageous in that safety of the machine operators is properly ensured even in an electronic component assembling line in which the small-sized thin unit apparatuses are combined. Therefore, it is useful to the electronic component assembling line constituted by combining plural apparatuses.

The present application is based on Japanese patent application No. 2007-333764, filed on Dec. 26, 2007, the entire contents of which are incorporated herein by reference.

The invention claimed is:

1. An electronic component mounting apparatus having a plurality of electronic component loading apparatuses combined to constitute an electronic component assembling line in which component-mounted substrates are manufactured by mounting electronic components on substrates, the electronic component mounting apparatus comprising:
   a substrate carry unit constituting a carrying path of the electronic component assembling line arranged between an upstream end and a downstream end thereof to carry the substrates;
   a working operation unit executing a working operation to mount components to the substrates that are carried by the substrate carry unit;
   a pair of opening sections through which the substrates pass and which are located at the upstream end and the downstream end of the substrate carry unit and formed in cover members, wherein each of the cover members covers each of the electronic component loading apparatuses,
   a foreign matter detection unit detecting an entry of an unexpected foreign matter that is other than the substrates through the opening sections located at the upstream end and the downstream end;
   an adjacent apparatus stop processing unit executing an emergency stop processing, when the entry of the foreign matter is detected at one of the opening sections, to stop the electronic component mounting apparatus that is adjacent to the opening section at which the entry of the foreign matter is detected.

2. An electronic component mounting apparatus according to claim 1, further comprising:
   a cover lid provided on a side of an operation face in the electronic component mounting apparatus so as to be openable and closable such that an operator is accessible to an operation area in the working operation unit; and
   a lid open/close detection unit detecting opening and closing of the cover lid,
   wherein the adjacent apparatus stop processing unit executes the emergency stop processing to stop the adjacent electronic component mounting apparatus only in a case that the lid open/close detection unit detects opening of the cover lid and the foreign matter detection unit detects the entry of the foreign matter.

3. A stopping method of an electronic component mounting apparatus in an emergency having a plurality of electronic component loading apparatuses combined to constitute an electronic component assembling line in which component-mounted substrates are manufactured by mounting electronic components on substrates, the electronic component mounting apparatus comprising:
   a substrate carry unit provided with a carrying path arranged between an upstream end and a downstream end thereof to carry the substrates in the electronic component assembling line;
   a working operation unit executing a working operation to mount components to the substrates that are carried by the substrate carry unit;
   a pair of opening sections through which the substrates pass and which are located at the upstream end and the downstream end of the substrate carry unit and formed in cover members, wherein each of the cover members covers each of the electronic component loading apparatuses,
   a foreign matter detection unit detecting an entry of an unexpected foreign matter that is other than the substrates through the opening sections located at the upstream end and the downstream end;
   wherein an emergency stop processing is executed, when the entry of the foreign matter is detected at one of the opening sections, to stop the electronic component mounting apparatus that is adjacent to the opening section at which the entry of the foreign matter is detected.

4. A stopping method of an electronic component mounting apparatus in an emergency according to claim 3, the electronic component mounting apparatus, further comprising:
   a cover lid provided on a side of an operation face in the electronic component mounting apparatus so as to be openable and closable such that an operator is accessible to an operation area in the working operation unit; and
   a lid open/close detection unit detecting opening and closing of the cover lid,
   wherein the emergency stop processing to stop the adjacent electronic component mounting apparatus is executed only in a case that the lid open/close detection unit detects opening of the cover lid and the foreign matter detection unit detects the entry of the foreign matter.

* * * * *